Sept. 29, 1970 S. K. AMMANN 3,531,656

PRECISION RECTIFIER CIRCUIT

Filed Oct. 6, 1967

INVENTOR.
STEPHAN K. AMMANN
BY
ATTORNEY

United States Patent Office 3,531,656 Patented Sept. 29, 1970

3,531,656
PRECISION RECTIFIER CIRCUIT

Stephan K. Ammann, Cupertino, Calif., assignor, by mesne assignments, to Systron-Donner, Concord, Calif., a corporation of Delaware Filed Oct. 6, 1967, Ser. No. 673,431
Int. Cl. H03k 5/20, 5/00
U.S. Cl. 307—235 10 Claims

ABSTRACT OF THE DISCLOSURE

A rectifying circuit having high accuracy (0.01 percent) and high input impedance (on the order of kilomegohms) produces an output current that is a linear representation of the absolute value of a corresponding input signal. The circuit needs fewer and less costly components compared to other designs, it is relatively inexpensive to assemble, and it needs fewer adjustments. In addition, the circuit eliminates the need for a second differential amplifier, a second zero adjust means, and a pair of matched precision resistors.

BACKGROUND OF THE INVENTION

Field of the invention

This invention relates to a precision rectifier circuit. In particular, this invention relates to a circuit capable of producing an output current that is a linear representation of the absolute value of a corresponding input signal.

Description of the prior art

In a number of electrical circuit applications, there is a need for precision rectifiers; for example, in measuring instruments, such as digital voltmeters and A-C to D-C converters. With the availability of solid state components along with the development of digital techniques, circuits can be assembled that are small, highly accurate, and inexpensive.

Several approaches are used to fabricate precision rectifier circuits. In one, the circuit produces an output voltage that is a linear representation of the absolute value of the input signal. This type of circuit normally requires a precision inverter comprising a differential amplifier and a pair of precision resistors closely matched, a polarity detector, and an analog switch. The polarity detector functions to set the switch either to the input or the output of the inverting amplifier in order to have a single polarity output. These components are relatively expensive, especially the pair of precision resistors. Moreover, if the analog switch comprises a mechanical mechanism, it is slow and less reliable. On the other hand, if the switch comprises solid state components, it is fast and reliable, but needs relatively complex circuitry. In addition, the input impedance, normally around one megohm, is much too low for some applications, resulting in possible inaccuracies and unnecessarily high power dissipation.

In another approach the circuit produces an output current that is a linear representation of the absolute value of the input signal. This type of circuit normally requires a pair of matched precision resistors, which are expensive. In addition, two differential amplifiers are needed, one more than the circuit described above, the second differential amplifier usually needing an additional potentiometer for making a zero offset adjustment. Although this latter circuit provides a higher input impedance than the former (by a factor of around 1,000) and thus is preferred for many applications, the circuit requires more parts, is more expensive to build, and needs more adjustment from time to time compared to the former circuit. A precision rectifier is needed, therefore, which not only has a high input impedance (on the order of kilomegohms), but is also highly accurate and is relatively inexpensive to build. In addition, the number of critical components needed should be at a minimum, and the circuit requires as few adjustments as possible.

SUMMARY OF THE INVENTION

Briefly, the invented precision rectifier circuit comprises a differential amplifier means having a first input means, a negative gain input means, and a first output means that is responsive to a voltage difference between the first input means and the negative gain input means. In addition, the circuit includes a second input means, which is coupled to the negative gain input means by a resistor. A first three-terminal amplifying means with a high output impedance has one terminal responsively coupled to the first output means, a second terminal coupled to a second output means, and a third terminal coupled to the negative input means. When the input signal to the first or second input means is of a predetermined polarity, current flows trhough the first amplifying means between the second output means and the negative gain input means. A first diode means is coupled between the second input means and a source of fixed potential for providing a forward bias therebetween when the input signal is of the predetermined polarity. A second three-terminal amplifying means with a high output impedance has one terminal coupled to the second output means, a second terminal coupled to the second input means, and a third terminal coupled to a source of fixed potential. When the input signal is of a polarity opposite to the predetermined polarity, current flows through the second amplifying means. A second diode means is coupled between the negative gain input means and the first output means for providing a forward bias therebetween whenever the input signal is of the opposite polarity. When a load means is coupled to the second output means, the amplitude of the current between the second output means and the load means is linearly proportional to the absolute value of the voltage difference of a corresponding input signal.

The invented precision rectifier presents several features that are substantial improvements over prior art circuits. The invention can operate as a highly accurate rectifying circuit (approximately 0.01 percent) with a high input impedance (on the order of kilomegohms). In addition, the rectifier eliminates the need for a second differential amplifier, a second zero adjustment, and a pair of matched precision resistors. Thus, compared to prior art rectifiers of the same relative accuracy, the circuit requires fewer and less costly components that are relatively inexpensive to assemble, and needs fewer adjustments.

DESCRIPTION OF THE PREFERRED EMBODIMENTS

Figure 1:
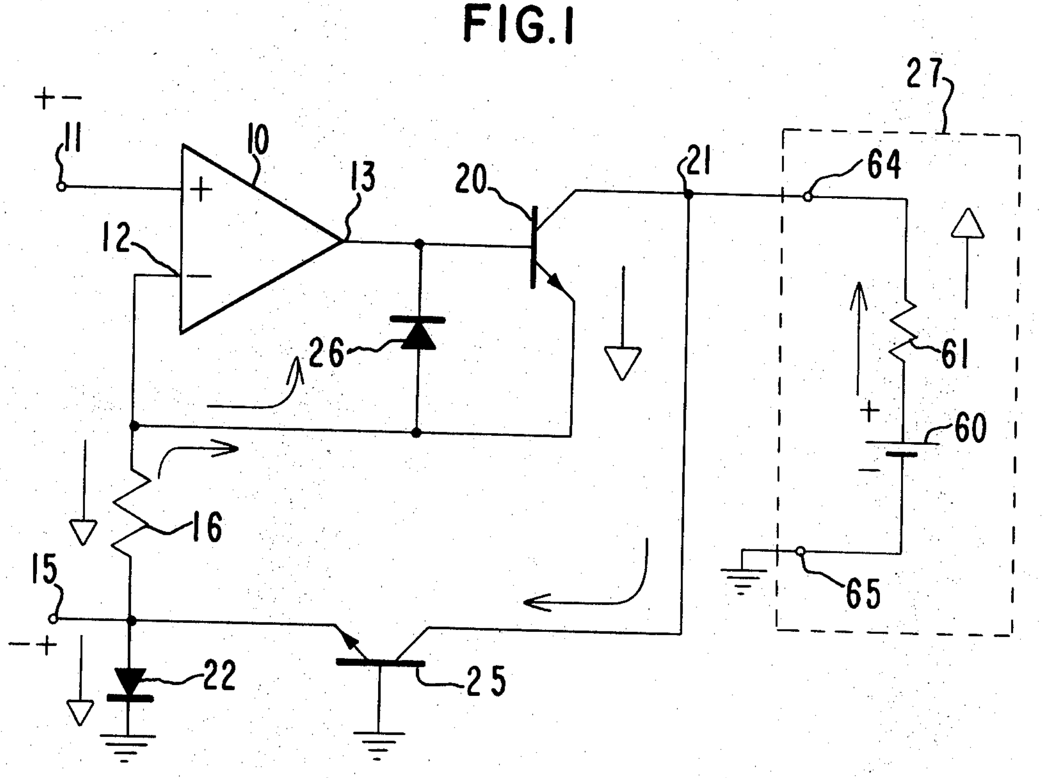
FIG. 1 is a schematic circuit diagram of the preferred embodiment of the circuit of the subject invention.

Referring to FIG. 1, the differential amplifier means is shown as a differential amplifier 10 having a first input means 11, a negative gain input means 12, and a first output means 13. Preferably, the amplifier 10 is chopper stabilized with an offset adjustable to 0 volts. Whenever there is a voltage at the first input means 11 that is different from the voltage at the negative gain input means 12, a signal is produced at the first output means 13 which with a proper feedback loop will tend to make the voltage at the two input means 11 and 12 equivalent. The second input means 15 is coupled to the negative gain input means 12 by a resistor 16. By the selection and arrangement of components as will be described below, the output current is accurately a linear function of the absolute value of the input voltage signal divided by the value of this resistor 16. A first amplifier means having a high output impedance may comprise a semiconductor device, such as an NPN transistor 20. The base of transistor 20 is responsively coupled to the first output means 13, the collector is coupled to a second output means 21, and the emitter is coupled to the negative gain input means 12. Transistor 20 is selected so that it has an extremely high current gain between its base and collector, at least above 10,000, and preferably around 40,000. Whenever the input signal is of a predetermined polarity, for example, a positive polarity, current flows through the first transistor 20 between the second output means 21 and the negative gain input means 12. A first diode means may comprise another semiconductor device, such as diode 22 having an anode coupled to the second input means 15 and a cathode coupled to a point of fixed potential, for example, ground. The first diode 22 provides a forward bias between the second input means 15 and the point of fixed potential whenever the input signal is of a predetermined polarity. A second amplifier means having a high output impedance may comprise still another semiconductor device, such as an NPN transistor 25. The collector of transistor 25 is coupled to the second output means 21, the base is coupled to a point of fixed potential, and the emitter is coupled to the second input means 15. The second transistor 25 is selected so that it, too, has an extremely high current gain, at least above 10,000 and preferably around 40,000. When the input signal is of a polarity opposite to the predetermined polarity, that is, a negative polarity, current flows through the second transistor 25. A second diode means may comprise yet another semiconductor device, such as diode 26, having an anode coupled to the negative gain input means 12 and a cathode coupled to the first output means 13. A forward bias is provided therebetween whenever the input signal is of the opposite polarity, that is, a negative polarity.

The invented circuit is rendered operative by coupling a load means 27 to the second output means 21 and a power supply to the differential amplifier means 10. Input signals generally are of a positive or negative D-C level. If the input signal is positive (indicated by a "+" at input means 11 and a "—" at input means 15), the first input means 11 will be at a higher positive voltage level than the negative gain input means 12. Because of this difference, the differential amplifier 10 generates a positive signal at the first output means 13, which in turn is applied to the base of NPN transistor 20, allowing current to flow through transistor 20 in proportion to the amplitude of the voltage level appearing at the base. Current flow (indicated by arrows with closed heads) is through the first transistor 20 between the second output means 21 and the negative gain input means 12. Enough current must flow through resistor 16 to cause a voltage drop whereby the voltage level of the negative gain input means 12 is at approximately the same voltage level as that of the first input means 11. This level is essentially a product of the resistance value of the resistor 16 times amplitude of the current. During positive polarity input signals, the voltage level on the second input means 15 is held at least at +0.5 volt, which forward biases the first diode 22 to the source of fixed potential and, in addition, prevents any current from flowing through the second transistor 25. Also, the second diode 26 is reverse biased so that no signal is conducted through it. After the current has passed through the transistor 20 and the resistor 16, it flows through the first diode 22 and then to the source of fixed potential. If the transistor 20 is chosen so that it has a high current gain, at least 10,000 and preferably around 40,000, and if the differential amplifier 10 has a very small input bias current, say less than one nanoampere, then the output current is accurately $V_{in}/R$ where $V_{in}$ is the voltage level of the input signal and R is the value of the resistor 16.

On the other hand, when a negative D-C level is applied (indicated by a "—" at means 11 and a "+" at means 15), the differential amplifier 10 generates a negative signal at the first output means 13 which is sufficient to cause the voltage level at the negative gain input means 12 to be at approximately the same negative level as that of the first input means 11. When the negative signal from the first output means 13 is applied to the base of transistor 20, the transistor 20 is turned off. Thus, for a negative voltage, the effective signal path (indicated by arrows with open heads) is from the first output means 13, through the second diode 26, and across the resistor 16. During negative polarity input signals, the voltage level on the second input means 15 is held at least at —0.5 volt which causes the first diode 22 to be reverse biased with respect to the source of fixed potential and, in addition, permits current to flow through the second transistor 25. Current may now flow from the second output means 21, through second transistor 25, across the resistor 16 causing a voltage drop, through diode 26, which is forward biased, and into the first output means 13. The voltage drop across the resistor 16 is the product of the current times the resistance value, and is enough to cause the negative voltage appearing at the negative gain input means 12 to be at the same negative level as that of the input signal applied to the first input means 11. If the transistor 25 is chosen so that it has a high current gain, at least 10,000 and preferably around 40,000, and if the differential amplifier 10 has a very small input bias current, less than one nanoampere, then the output current is accurately $V_{in}/R$ where $V_{in}$ is the voltage level of the input signal and R is the value of the resistor 16. Because there are different current paths, depending upon whether the input signal is positive or negative, the current flowing through the second output means can be always in the same direction with an amplitude that is proportional to the absolute value of the input signal.

Figure 2:
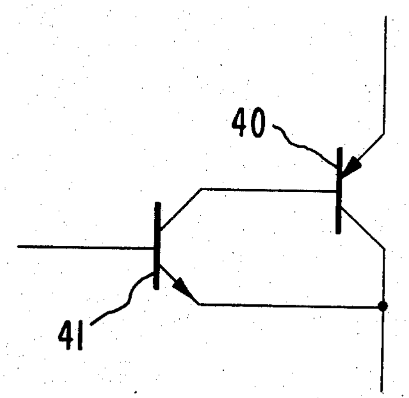
FIG. 2 is a schematic diagram of an alternative embodiment of the first or second amplifier means.

In order for the circuit to operate with the high accuracy needed, transistors 20 and 25 should have an extremely high gain. However, in place of individual transistors, several alternative embodiments can be used to obtain easily the necessary high gain. For example, as shown in FIG. 2, transistors 40 and 41, one a PNP and another an NPN transistor, are connected in a complementary Darlington configuration for use in place of transistor 20 or 25, or both. The gain of transistors 40 and 41 individually might be around 200, whereas in the configuration shown, the net gain of the two transistors is approximately 40,000, a value well within the range necessary for high circuit accuracy. As a replacement for transistor 20, transistor 40 is a PNP type having an emitter coupled to the second output means 21 and a collector coupled to the negative gain input means 12. Transistor 41, on the other hand, is an NPN type having a collector coupled to the base of transistor 40, a base responsively coupled to the first output means 13, and an emitter coupled to the collector of transistor 40. Similarly, as a replacement for transistor 25, transistor 40 should have an emitter coupled to the second output means 21 and a collector coupled to the second input means 15; and transistor 41 should have a collector coupled to the base of transistor 40, a base coupled to a source of fixed potential, such as ground, and an emitter coupled to the collector of transistor 40. If transistors 40 and 41 each has a gain of around 200, then in the configuration shown, the combined gain of the two transistors 40 and 41 is around 40,000.

For the circuit of FIG. 1, the load means 27 may be a voltage source as illustrated. Load means 27 may comprise a battery 60 coupled in series with the resistor 61, and two terminals 64 and 65. Terminal 64 is connected to the second output means 21, and terminal 65 is coupled to a point of fixed potential, such as ground. As a voltage source, load means 27 serves to supply a voltage to the circuit of FIG. 1 that is responsive to input signals. On the other hand, if PNP transistors are used in place of NPN transistors 20 and 25 and if the bias direction of diodes 22 and 26 is reversed, then the direction of current flow is the reverse of that for a circuit having NPN transistors. The load means 27 may then be a voltage source to receive current from the second output means 21, the amplitude of the current being linearly proportional to the amplitude of the input signal. If the load means 27 is to operate as a current sink, the terminals of battery 60 should be reversed from that shown in FIG. 1. There are other types of circuits that may comprise the load means 27. For example, in a typical application of the invented circuit, the load means may comprise an analog-to-digital converter or a panel meter.

In order to provide a further illustration of an embodiment of the precision rectifier circuit in accordance with the above description and applicable drawings, suitable values or part numbers for the various components are given below:

Differential Amplifier 10—ADO 26 (Fairchild Instrumentation).
Transistor 40—2N4033.
Transistor 41—2N2484.
Diode 22—1N3595.
Diode 26—1N3595.
Resistor 16—10K ohms±.01%.
Resistor 61—1K ohms.
Battery 60—10 volts.

A circuit comprising the components indicated produced an output signal that was a linear function of the absolute value of the corresponding input signal within an accuracy of 0.01 percent.

While the present invention has been illustrated and described with respect to specific embodiments, it will be appreciated that numerous variations and modifications in the selection, combination, and arrangement of components may be made without departing from the scope and spirit of the invention. For example, in place of bipolar transistors as the first and second amplifier means, it is within the scope of the invention to use MOS transistors, FET transistors, or any other type of semiconductor or electronic device or combination thereof which has a high output impedance and high gain to enable the circuit to operate with the precision required.

I claim:

1. A precision rectifier for producing an output signal that is a linear function of the absolute value of the corresponding input signal comprising: a differential amplifier means having a first input means, a negative gain input means, and a first output means, said first output means responsive to a voltage difference between said first input means and said negative gain input means; a resistor coupled between said negative gain input means and a second input means; a first three-terminal amplifying means having a high output impedance, one terminal thereof responsively coupled to said first output means, a second terminal thereof coupled to a second output means, and a third terminal thereof coupled to said negative gain input means, wherein current flows through said first amplifying means between said second output means and said negative gain input means when the input signal to said first and second input means is of a predetermined polarity; a first diode means coupled between said second input means and a point of fixed potential for providing a forward bias therebetween when the input signal is of said predetermined polarity; a second three-terminal amplifying means having a high output impedance, one terminal coupled to said second output means a second terminal coupled to said second input means and a third terminal coupled to said point of fixed potential, wherein current flows through said second amplifying means when the input signal is of a polarity opposite to said predetermined polarity; a second diode means coupled between said negative gain input means and said first output means for providing a forward bias therebetween whenever the input signal is of said opposite polarity, whereby when a load means is coupled to said second output means the amplitude of the signal to said second output means is linearly proportional to the absolute value of a corresponding input signal.

2. The circuit recited in claim 1 wherein said first amplifying means comprises a first transistor connected in an emitter-follower configuration, and said second amplifying means comprises a second transistor connected in a common-base configuration.

3. The circuit recited in claim 1 wherein said first amplifying means comprises a first NPN transistor having a collector coupled to said second output means, an emitter coupled to said negative gain input means, and a base coupled to said first output means; said second amplifying means comprises a second NPN transistor having a collector coupled to said second output means, an emitter coupled to said second input means, and a base coupled to said point of fixed potential; said first diode means comprises a first diode having an anode coupled to said second input means and a cathode coupled to said point of fixed potential; and said second diode means comprises a second diode having an anode coupled to said negative gain input means and a cathode coupled to said first output means.

4. The circuit recited in claim 3 wherein the respective current gain of said first and second transistors between the base and collector thereof is greater than 10,000.

5. The circuit recited in claim 4 wherein said load means provides to said second output means a current that is linearly proportional to the absolute value of the voltage difference of the input signal to said first and second input means.

6. The circuit recited in claim 5 wherein said load means comprises a battery coupled in series to a resistor and two terminals, one terminal coupled to said second output means and another terminal coupled to said point of fixed potential.

7. The circuit recited in claim 1 wherein said first and second amplifying means comprise a respective first and second pair of transistors connected in a complementary Darlington configuration, whereby the net current gain of each of said configurations is greater than 10,000.

8. The circuit recited in claim 7 wherein said first transistor pair comprises a first PNP transistor having an emitter coupled to said second output means and a collector coupled to said negative gain input means, and a first NPN transistor having a collector coupled to the base of said first PNP transistor, a base responsively coupled to said first output means, and an emitter coupled to said collector of said first PNP transistor; said second transistor pair comprises a second PNP transistor having an emitter coupled to said second output means and a collector coupled to said second input means, and a second NPN transistor having a collector coupled to the base of said second PNP transistor, a base coupled to said point of fixed potential, and an emitter coupled to said collector of said second PNP transistor; said first diode means comprises a first diode having an anode coupled to said second input means and a cathode coupled to said point of fixed potential; and said second diode means comprises a second diode having an anode coupled to said negative gain input means and a cathode coupled to said first output means.

9. The circuit recited in claim 8 wherein the output signal is a linear representation of the absolute value of the corresponding input signal within 0.01 percent accuracy.

10. A precision rectifier circuit comprising:

a differential amplifier having two input terminals and an output terminal;

a source of polarity varying input voltage signals coupled across said two input terminals, one of which is coupled through a resistive means;

a means including a first amplifier coupled to said output terminal of said differential amplifier operative to produce a current linearly proportional to input voltage signals of a first polarity;

a means including a second amplifier coupled to said source and operative to produce a current linearly proportional to input voltage signals of a second polarity, said first and second amplifiers having a common output terminal; and, a load means connected to said common output terminal.

References Cited

UNITED STATES PATENTS 3,311,826 3/1967 Galman ---------- 328—26 XR

DONALD D. FORRER, Primary Examiner

J. ZAZWORSKY, Assistant Examiner

U.S. Cl. X.R.

307—229, 262; 328—26, 150